US009553508B1

(12) United States Patent
Chu et al.

(10) Patent No.: US 9,553,508 B1
(45) Date of Patent: Jan. 24, 2017

(54) PROTECTION CIRCUIT

(71) Applicant: TAIWAN SEMICONDUCTOR MANUFACTURING CO., LTD., Hsinchu (TW)

(72) Inventors: Yu-Lin Chu, Hsinchu (TW); Chin-Yuan Ko, Hsinchu (TW); Hsi-Yu Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/839,592

(22) Filed: Aug. 28, 2015

(51) Int. Cl.
*H01L 27/02* (2006.01)
*H02M 3/08* (2006.01)

(52) U.S. Cl.
CPC ............ *H02M 3/08* (2013.01); *H01L 27/0255* (2013.01); *H01L 27/0266* (2013.01)

(58) Field of Classification Search
CPC .... H01L 27/0255; H01L 27/0266; H02M 3/08
See application file for complete search history.

(56) References Cited

U.S. PATENT DOCUMENTS

| 5,796,147 | A | * | 8/1998 | Ono | H01L 27/0218 257/355 |
| 6,624,479 | B2 | * | 9/2003 | Sawahata | H01L 27/0266 257/355 |
| 7,760,009 | B2 | * | 7/2010 | Yang | H03K 19/0013 327/534 |
| 8,139,330 | B2 | * | 3/2012 | Ishii | H01L 27/0251 361/56 |
| 2013/0256801 | A1 | | 10/2013 | Yen et al. | |

* cited by examiner

*Primary Examiner* — Jeffrey Zweizig
(74) *Attorney, Agent, or Firm* — Maschoff Brennan

(57) ABSTRACT

A circuit that includes a first diode-connected dummy device, a second diode-connected dummy device, a third diode-connected dummy device, a fourth diode-connected dummy device, and a first discharge path. The second diode-connected dummy device connected in cascode with the first diode-connected dummy device. The fourth diode-connected dummy device connected in cascode with the third diode-connected dummy device. The first and the second diode-connected dummy devices are formed in a first region. The third and the fourth diode-connected dummy devices are formed in a second region which is outside the first region. The first discharge path configured to discharge charges from at least one of the first and the second diode-connected dummy devices in the first region to a reference voltage terminal of one of the third and the fourth diode-connected dummy devices in the second region.

20 Claims, 3 Drawing Sheets

PROTECTION CIRCUIT

BACKGROUND

Deep well is frequently used as isolation between noisy and non-noisy region in a chip. For example deep well is used as the isolation of noisy digital block and non-noisy analog block in a chip. However, during fabricating processes including, for example, metal etching and/or via etching, charges are stored in a deep well region. When the fabricating processes are constructed, a potential drop across a gate oxide for a device outside the deep well region is built due to the stored charges. The gate oxide for the device outside the deep well region could be damaged due to the discharged charges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Figure 1:
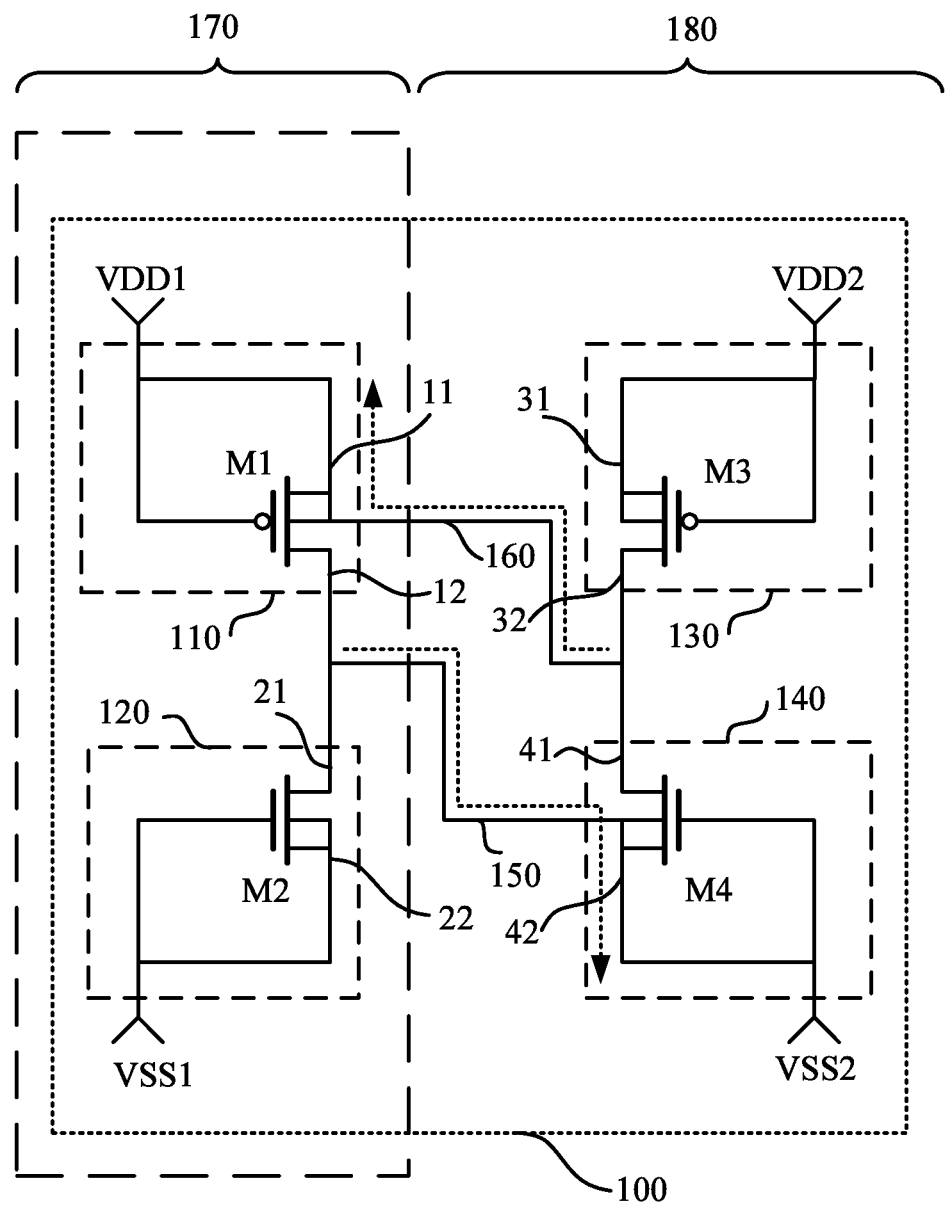
FIG. 1 is a schematic diagram of a protection circuit in accordance with some embodiments of the present disclosure.

FIG. 1 is a schematic diagram of a protection circuit 100 in accordance with some embodiments of the present disclosure.

As illustratively shown in FIG. 1, the protection circuit 100 includes diode-connected dummy devices 110, 120, 130 and 140, and at least one of a discharge path 150 and a discharge path 160. For illustration, the diode-connected dummy device 120 is connected in cascode with the diode-connected dummy device 110. The diode-connected dummy devices 110 and 120 are formed in a region 170. The diode-connected dummy device 140 is connected in cascode with the diode-connected dummy device 130. The diode-connected dummy devices 130 and 140 are formed in a region 180 which is outside the region 170.

In operation, the diode-connected dummy devices 110, 120, 130, and 140 are normally turned off under a normal operation, and operated as discharging devices for discharging charges in the region 170 and/or the region 180.

In this document, the term "diode-connected" indicates that devices including, for example, transistors, are connected as diodes. For illustration, a source/drain terminal is connected to a gate terminal of a P-type or an N-type Metal Oxide Semiconductor Field Effect (MOSFET) transistor. For alternative illustration, a collector/emitter terminal is connected to a base terminal of a PNP-type or an NPN-type Bipolar Junction Transistor (BJT). Various devices, that are connected as diodes, are within the contemplated scope of the present disclosure.

In this document, the term "dummy device" indicates a device that is configured and/or operated to improve yield and/or performance of integrated circuits. For illustration, dummy devices prevent the integrated circuits from damages due to stored charges.

In some embodiments, the protection circuit 100 includes the discharge path 150 without the discharge path 160. The discharge path 150 is configured to discharge charges from at least one of the diode-connected dummy devices 110 and 120 in the region 170 to a reference voltage terminal of one of the diode-connected dummy devices 130 and 140 in the region 180. Accordingly, the charges in the region 170 are discharged through the discharge path 150. As a result, other circuit components (not shown) in the region 180 are able to be prevented from being damaged by the charges in the region 170.

In some other embodiments, the protection circuit 100 includes the discharge path 160 without the discharge path 150. The discharge path 160 is configured to discharge charges from at least one of the diode-connected dummy devices 130 and 140 in the region 180 to a reference voltage terminal of one of the diode-connected dummy devices 110 and 120 in the region 170. Accordingly, the charges in the region 180 are discharged through the discharge path 160. As a result, other circuit components (not shown) in the region 170 are able to be prevented from being damaged by the charges in the region 180.

In some alternative embodiments, the protection circuit 100 includes both of the discharge paths 150 and 160. The functions and operations of the discharge paths 150 and 160 are described above, and thus they are not repeated herein. In such embodiments, the discharge paths 150 and 160 provide a bi-directional protection for circuit components (not shown) in the regions 170 and 180.

In various embodiments, the protection circuit 100 includes the diode-connected dummy devices 110 and 140, and at least one of the discharge path 150 and the discharge path 160, without the diode-connected dummy devices 120 and 130. As described above, the discharge path 150 is configured to discharge charges from the diode-connected dummy devices 110 in the region 170 to the reference voltage terminal of the diode-connected dummy devices 140 in the region 180. Moreover, the discharge path 160 is configured to discharge charges from the diode-connected dummy devices 140 in the region 180 to the reference voltage terminal of the diode-connected dummy devices 110 in the region 170. In such embodiments, the protection circuit 100 still provides protection for the circuit components, and required area of the protection circuit 100 is reduced.

Numbers and configurations of the diode-connected dummy devices in FIG. 1 are given for illustrative purposes. Various numbers and configurations of the diode-connected dummy devices in FIG. 1 are within the contemplated scope of the present disclosure.

Moreover, the number and configuration of the discharge paths 150 and 160 illustrated in FIG. 1 are given for illustrative purposes. Various numbers and configurations of the discharge paths are within the contemplated scope of the present disclosure.

As illustratively shown in FIG. 1, in some embodiments, the region 170 is a deep N-well (DNW) region, and the region 180 that is outside the region 170 is a non-DNW region. For illustration of the discharge path 150 in FIG. 1, in a condition that positive charges are stored in the DNW region during a fabricating process, the positive charges in the DNW region are discharged through the discharge path 150 to the reference voltage terminal, which is configured to receive a reference voltage VSS2, of the diode-connected dummy device 140. This discharging operation is illustratively shown by an arrow with dotted line along the discharge path 150. As a result, circuit components in the non-DNW region are prevented from being damaged by the positive charges in the DNW region.

In further embodiments, the reference voltage VSS2 is a relatively low voltage which includes, for example, ground voltage.

For illustration of the discharge path 160 in FIG. 1, in a condition that negative charges are stored in the non-DNW region during a fabricating process, the negative charges in the non-DNW region are discharged through the discharge path 160 to the reference voltage terminal, which is configured to receive a reference voltage VDD1, of the diode-connected dummy device 110. This discharging operation is illustratively shown by an arrow with dotted line along the discharge path 160. As a result, circuit components in the DNW region are prevented from being damaged by the negative charges in the non-DNW region.

In further embodiments, the reference voltage VDD1 is a relatively high voltage which includes, for example, power voltage.

In some approaches, protection diodes are used to help bypass charges. However, the charge bypass efficiency of using the protection diodes depends on areas and numbers of the protection diodes.

Compared to the aforementioned approaches, the diode-connected dummy devices 110 and 140, or the diode-connected dummy devices 110, 120, 130 and 140, cooperate with the discharge path 150 and/or the discharge path 160, as described above, in order to perform discharging charges in the region 170 (e.g., DNW region), and/or in the region 180 (e.g., non-DNW region). Accordingly, the protection diodes used in the related approaches are not required. As a result, the area previously required for the protection diodes is saved, and the protection circuit 100 in the present disclosure is able to be effectively simplified without area penalty. In addition, due to the saved area, antenna rule related to an area ratio of the DNW region to gate oxide of MOS transistors outside the DNW region is not constrained in circuit design. Moreover, the discharge path 150 and/or the discharge path 160 are formed by a normal fabrication process, and thus no extra mask during the fabrication process is required. Accordingly, extra cost is not required as well.

In some embodiments, as illustratively shown in FIG. 1, the diode-connected dummy device 110 includes a Metal Oxide Semiconductor (MOS) transistor M1, the diode-connected dummy device 120 includes a MOS transistor M2, the diode-connected dummy device 130 includes a MOS transistor M3, and the diode-connected dummy device 140 includes a MOS transistor M4. A terminal 11 of the MOS transistor M1 is configured to receive the reference voltage VDD1, a terminal 22 of the MOS transistor M2 is configured to receive a reference voltage VSS1, a terminal 31 of the MOS transistor M3 is configured to receive a reference voltage VDD2, and a terminal 42 of the MOS transistor M4 is configured to receive the reference voltage VSS2. In further embodiments, each one of the reference voltages VDD1 and VDD2 is a relatively high voltage which includes, for example, power voltage, and each one of the reference voltage VSS1 and VSS2 is a relatively low voltage which includes, for example, ground voltage.

A terminal 12 of the MOS transistor M1 is connected to a terminal 21 of the MOS transistor M2, and a terminal 32 of the MOS transistor M3 is connected to a terminal 41 of the MOS transistor M4. The terminal 42 of the MOS transistor M4 is connected to the terminal 12 of the MOS transistor M1 through the discharge path 150.

The terminal 41 of the transistor M4 is further connected, in some other embodiments, to the terminal 11 of the MOS transistor M1, through the discharge path 160.

Under a normal operation, the MOS transistors M1, M2, M3 and M4 are normally turned off, and operated as discharging transistors for discharging charges in the region 170 and/or the region 180.

In various embodiments, the MOS transistors M2 and M3 are omitted. Alternatively stated, the protection circuit 100 includes the MOS transistors M1 and M4, and the discharge paths 150 and/or 160, without the MOS transistors M2 and M3. Numbers and configurations of the MOS transistors in FIG. 1 are given for illustrative purposes. Various numbers and configurations of the MOS transistors in FIG. 1 are within the contemplated scope of the present disclosure.

The MOS transistors M1, M2, M3 and M4 are given for illustrative purposes. Various types of devices including, for example, bipolar junction transistor (BJT), are within the contemplated scope of the present disclosure.

In further embodiments, the MOS transistors M1 and M3 are P-type MOS (PMOS) transistors, and the MOS transistors M2 and M4 are N-type MOS (NMOS) transistors. The terminals 11 and 31 of the MOS transistors M1 and M3 are source terminals of PMOS transistors, and the terminals 12 and 32 of the MOS transistors M1 and M3 are drain terminals of the PMOS transistors. The terminals 21 and 41 of the MOS transistors M2 and M4 are drain terminals of NMOS transistors, and the terminals 22 and 42 of the MOS transistors M2 and M4 are source terminals of NMOS transistors. The configurations and arrangements of the transistors M1 and M3 being PMOS transistors and the transistors M2 and M4 being NMOS transistors are given for illustrative purposes. Various configurations and arrangements of the transistors M1, M2, M3 and M4 are within the contemplated scope of the present disclosure.

Figure 2:
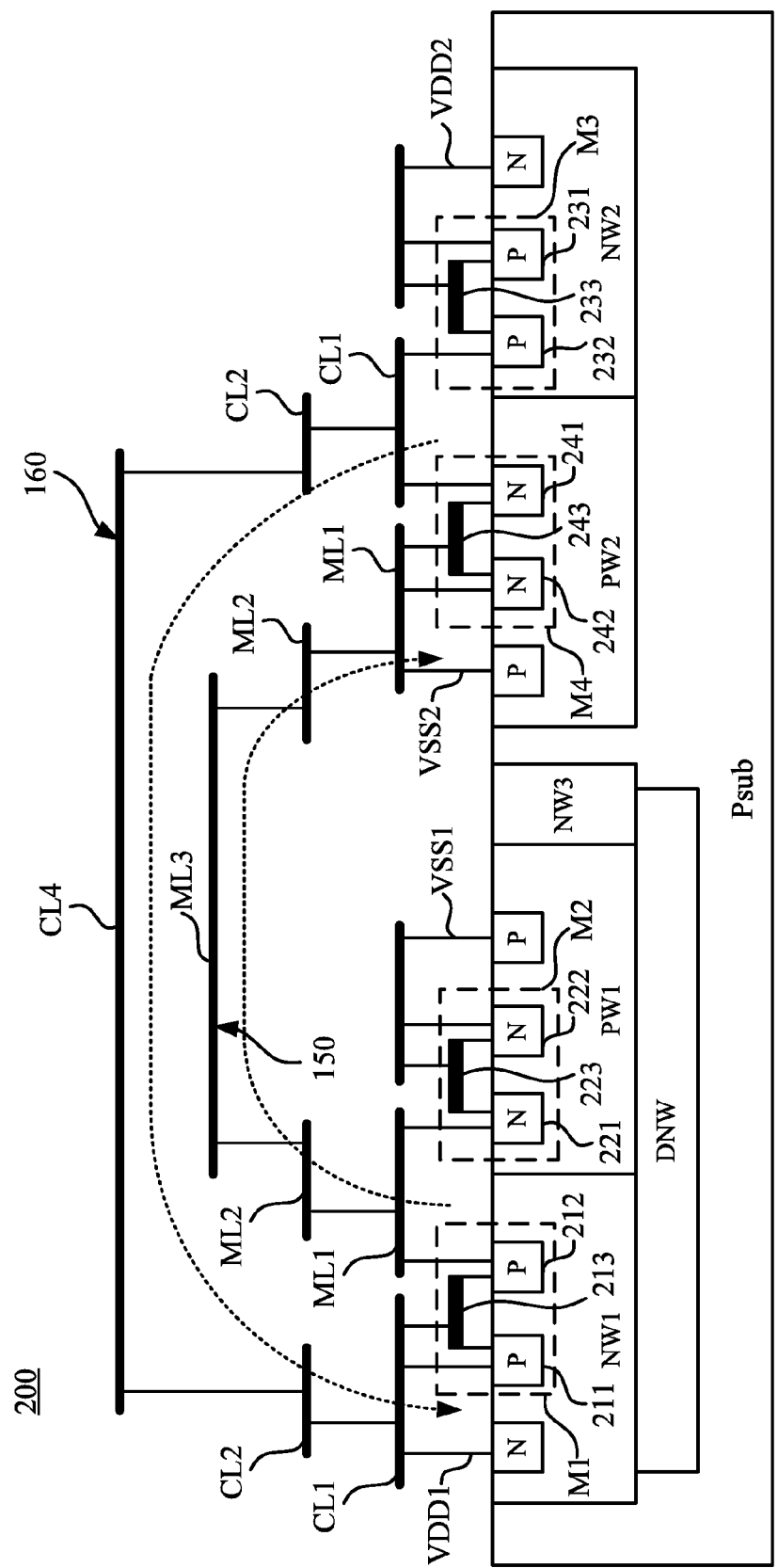
FIG. 2 is a schematic diagram illustrating a cross-sectional view of a semiconductor structure of the protection circuit in FIG. 1, in accordance with some embodiments of the present disclosure.

FIG. 2 is a schematic diagram illustrating a cross-sectional view of a semiconductor structure 200 of the protection circuit 100 in FIG. 1, in accordance with some embodiments of the present disclosure.

For illustration in FIG. 2, the semiconductor structure 200 includes the MOS transistors M1, M2, M3 and M4, and the discharge paths 150 and 160. The MOS transistors M1 and M2 are formed in the DNW region, and the MOS transistors M3 and M4 are formed in the non-DNW region, as described above in FIG. 1. As illustratively shown in FIG. 1 and FIG. 2, a P-type region 211 corresponds to the terminal 11 of the MOS transistor M1, and a P-type region 212 corresponds to the terminal 12 of the MOS transistor M1. The P-type regions 211 and 212 are formed in an N-well region NW1 that is in the DNW region. For the MOS transistor M2, an N-type region 221 corresponds to the terminal 21 of the MOS transistor M2, and an N-type region 222 corresponds to the terminal 22 of the MOS transistor M2. The N-type regions 221 and 222 are formed in a P-well region PW1 that is in the DNW region.

Moreover, for the MOS transistor M3, a P-type region 231 corresponds to the terminal 31 of the MOS transistor M3, and a P-type region 232 corresponds to the terminal 32 of the MOS transistor M3. The P-type regions 231 and 232 are formed in an N-well region NW2 that is in a P-type substrate Psub and outside the DNW region. For the MOS transistor M4, a N-type region 241 corresponds to the terminal 41 of the MOS transistor M4, and a N-type region 242 corresponds to the terminal 42 of the MOS transistor M4. The N-type regions 241 and 242 are formed in a P-well region PW2 that is in the P-type substrate Psub and outside the DNW region.

For illustration, the P-type regions 211 and 212 are configured as the source and drain terminals of the MOS transistor M1, respectively, and the electrode 213 is configured as the gate terminal of the MOS transistor M1. The N-type regions 221 and 222 are configured as the drain and source terminals of the MOS transistor M2, respectively, and the electrode 223 is configured as the gate terminal of the MOS transistor M2. The N-type regions 231 and 232 are configured as the source and drain terminals of the MOS transistor M3, respectively, and the electrode 233 is configured as the gate terminal of the MOS transistor M3. The N-type regions 241 and 242 are configured as the drain and source terminals of the MOS transistor M4, respectively, and the electrode 243 is configured as the gate terminal of the MOS transistor M4.

Moreover, in some embodiments, the discharge path 150 includes conductive layers ML1-ML3 including, for example, metal layers. For illustration, the conductive layers ML1-ML3 are sequentially formed and stacked between a terminal where the MOS transistors M1 and M2 are connected, and a reference voltage terminal of one of the MOS transistors M3 and M4. As illustratively shown in FIG. 2, the discharge path 150 is formed between a terminal where the P-type region 213 and the N-type region 221 are connected, and the reference voltage (e.g., VSS2) terminal of the MOS transistor M4. Accordingly, charges stored in the DNW region are discharged from the DNW region to the reference voltage terminal of the MOS transistor M4 through the discharge path 150 without damaging the MOS transistors M3 and M4, as illustrative shown by an arrow with dotted line along the discharge path 150. Therefore, with the presence of the discharge path 150, circuit components (not shown) in the non-DNW region are protected from damages caused by the charges in the DNW region.

In further embodiments, the conductive layers ML1-ML3 of the discharge path 150 are formed separate from or below signal transmitting layers (not shown). As a result, charges in the DNW region are discharged through the conductive layers ML1-ML3 to prevent the charges from flowing into the signal transmitting layers and causing damages to circuit components (not shown).

In some other embodiments, the discharge path 160 includes conductive layers CL1, CL2 and CL4 including, for example, metal layers. For illustration, the conductive layers CL1, CL2 and CL4 are sequentially formed and stacked between a terminal where the MOS transistors M3 and M4 are connected, and a reference voltage terminal of one of the MOS transistors M1 and M2. As illustratively shown in FIG. 2, the discharge path 160 is formed between a terminal where the P-type region 232 and the N-type region 241 are connected, and the reference voltage (e.g., VDD1) terminal of the MOS transistor M1. Accordingly, charges are discharged from the non-DNW region to the reference voltage terminal of the MOS transistor M1 through the discharge path 160 without damaging the MOS transistors M1 and M2, as illustrative shown by an arrow with dotted line along the discharge path 160. Therefore, with the presence of the discharge path 160, circuit components (not shown) in the DNW region are protected from damages caused by the charges in the non-DNW region.

In further embodiments, the conductive layers CL1, CL2 and CL4 of the discharge path 160 are formed separate from or below signal transmitting layers (not shown). As a result, charges in the non-DNW region are discharged through the conductive layers CL1, CL2 and CL4 to prevent the charges from flowing into the signal transmitting layers and causing damages to circuit components (not shown).

In various embodiments, the conductive layers ML1 and CL1 are formed in one process and/or one operation, and the conductive layers ML2 and CL2 are formed in one process and/or one operation.

Configurations of the P-type regions, N-type regions, well regions, and the conductive layers in FIG. 2 are given for illustrative purposes. Various configurations of the P-type regions, N-type regions, well regions, and the conductive layers are within the contemplated scope of the present disclosure.

Figure 3:
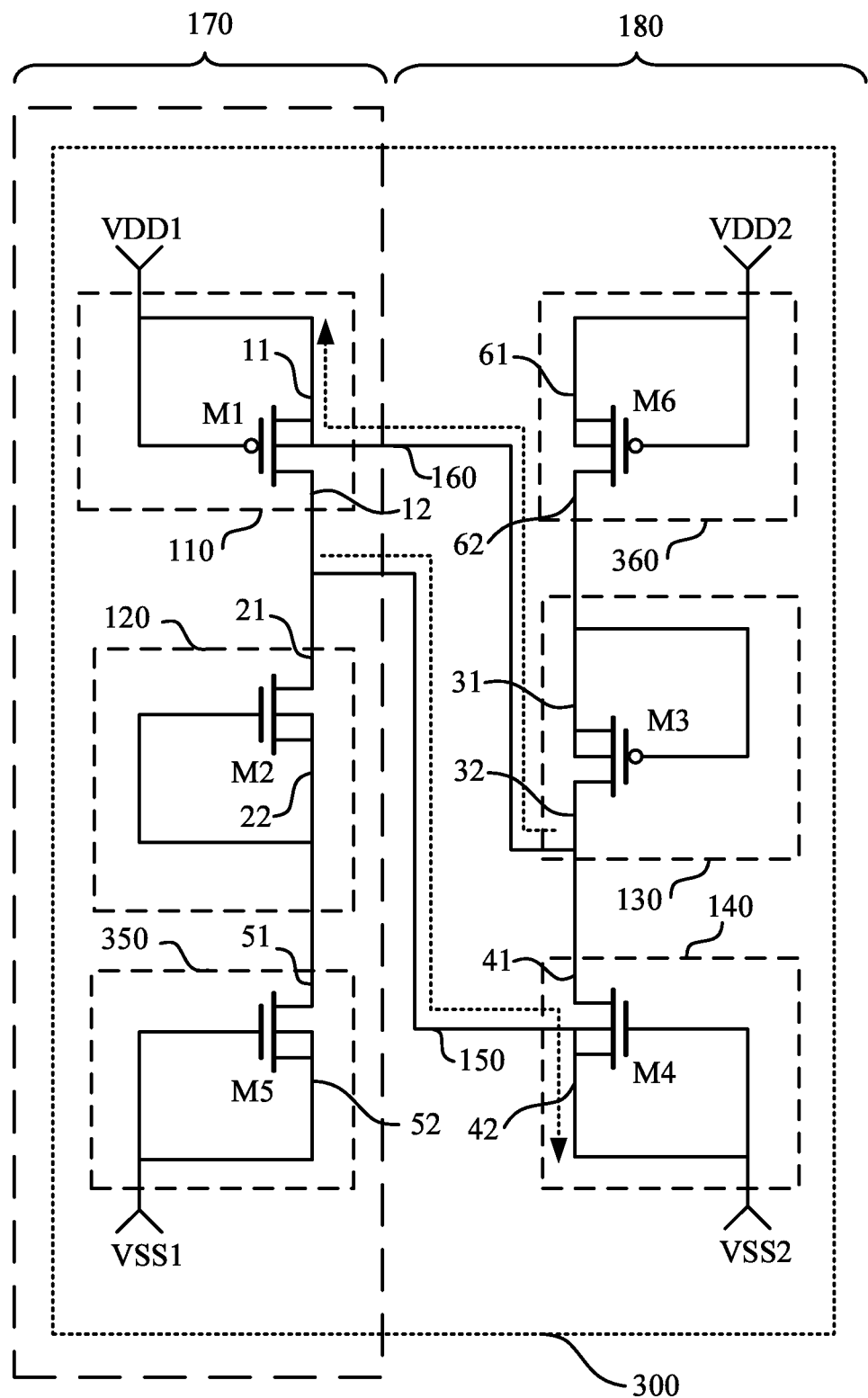
FIG. 3 is a schematic diagram of a protection circuit in accordance with various embodiments of the present disclosure.

Reference is now made to FIG. 3. FIG. 3 is a schematic diagram of a protection circuit 300 in accordance with various embodiments of the present disclosure.

Compared with the protection the circuit 100 in FIG. 1, the protection circuit 300 further includes at least one of a diode-connected dummy device 350 and a diode-connected dummy device 360.

In operation, the diode-connected dummy devices 110, 120, 130, 140, 350 and 360 are normally turned off under a normal operation, and operated as discharging devices for discharging charges in the region 170 and/or the region 180.

In some embodiments, the protection circuit 300 includes the diode-connected dummy device 350 without the diode-connected dummy device 360. The diode-connected dummy device 350 is connected in cascode with the diode-connected dummy device 120. The diode-connected dummy device 350 improves isolation between different reference voltages VDD1, VDD2, VSS1 and VSS2.

In some other embodiments, the protection circuit 300 includes the diode-connected dummy device 360 without the diode-connected dummy device 350. The diode-connected dummy device 360 is connected in cascode with the diode-connected dummy device 130. The diode-connected dummy device 360 improves isolation between the different reference voltages VDD1, VDD2, VSS1 and VSS2.

In some alternative embodiments, the protection circuit 300 includes both of the diode-connected dummy devices 350 and 360. The functions and configurations of the diode-connected dummy devices 350 and 360 are described above, and thus they are not repeated herein. In such embodiments, the diode-connected dummy devices 350 and 360 further improve isolation between the different reference voltages VDD1, VDD2, VSS1 and VSS2.

In further embodiments, the protection circuit 300 includes a plurality of diode-connected dummy devices connected in cascode between the diode-connected dummy device 120 and the diode-connected dummy device 350, and/or a plurality of diode-connected dummy devices connected in cascode between the diode-connected dummy device 130 and the diode-connected dummy device 360. Therefore, the protection circuit 300 further improves the isolation between the reference voltages.

The number and configuration of the diode-connected dummy devices 350 and 360 illustrated in FIG. 3 are given for illustrative purposes. Various numbers and configurations of the diode-connected dummy devices are within the contemplated scope of the present disclosure.

A cross section view of a discharge path 150 and/or a discharge path 160 of the protection circuit 300 is illustratively shown in FIG. 2. In some embodiments, the discharge path 150 includes conductive layers ML1-ML3 including, for example, metal layers. For illustration, the conductive layers ML1-ML3 are sequentially formed and stacked between a terminal where the MOS transistors M1 and M2 are connected, and a reference voltage terminal of one of the MOS transistors M3 and M4. As illustratively shown in FIG. 2, the discharge path 150 is formed between a terminal where the P-type region 213 and the N-type region 221 are connected, and the reference voltage (e.g., VSS2) terminal of the MOS transistor M4. The functions of the discharge path 150 are described above, and thus they are not repeated herein.

In further embodiments, the conductive layers ML1-ML3 of the discharge path 150 are formed separate from or below signal transmitting layers (not shown). As a result, charges in the DNW region are discharged through the conductive layers ML1-ML3 to prevent the charges from flowing into the signal transmitting layers and causing damages to circuit components (not shown).

In some other embodiments, the discharge path 160 includes conductive layers CL1, CL2 and CL4 including, for example, metal layers. For illustration, the conductive layers CL1, CL2 and CL4 are sequentially formed and stacked between a terminal where the MOS transistors M3 and M4 are connected, and a reference voltage terminal of one of the MOS transistors M1 and M2. As illustratively shown in FIG. 2, the discharge path 160 is formed between a terminal where the P-type region 232 and the N-type region 241 are connected, and the reference voltage (e.g., VDD1) terminal of the MOS transistor M1. The functions of the discharge path 160 are described above, and thus they are not repeated herein.

In further embodiments, the conductive layers CL1, CL2 and CL4 of the discharge path 160 are formed separate from or below signal transmitting layers (not shown). As a result, charges in the non-DNW region are discharged through the conductive layers CL1, CL2 and CL4 to prevent the charges from flowing into the signal transmitting layers and causing damages to circuit components (not shown).

In various embodiments, the conductive layers ML1 and CL1 are formed in one process and/or one operation, and the conductive layers ML2 and CL2 are formed in one process and/or one operation.

Similar to the protection circuit 100, the protection circuit 300 discharges charges in the region 170 (e.g., DNW region) through the discharge path 150 and/or discharges charges in the region 180 (e.g., non-DNW region) through the discharge path 160. Moreover, the diode-connected dummy devices 350 and/or 360 in the protection circuit 300 improve isolation between the reference voltages. Therefore, the protection circuit 300 effectively protects circuit components and stabilizes operation of the circuit components.

In some embodiments, the diode-connected dummy device 350 includes a MOS transistor M5, and the diode-connected dummy device 360 includes a MOS transistor M6. A terminal 52 of the MOS transistor M5 is configured to receive a reference voltage VSS1, and a terminal 61 of the MOS transistor M6 is configured to receive a reference voltage VDD2. With the presence of the MOS transistors M5 and/or M6, each built-in diode of the MOS transistors M5 and/or M6 improves isolation between the reference voltages VDD1, VDD2, VSS1 and VSS2.

Compared to the embodiments illustrated in FIG. 1, in the protection circuit 300, the terminal 22 of the MOS transistor M2 is connected to a terminal 51 of the MOS transistor M5, and a terminal 62 of the MOS transistor M6 is connected to the terminal 31 of the MOS transistor M3.

Under a normal operation, the MOS transistors M1, M2, M3, M4, M5 and M6 are normally turned off, and operated as discharging transistors for discharging charges in the region 170 and/or the region 180.

In further embodiments, the protection circuit 300 includes a plurality of MOS transistors connected in cascode between the terminal 22 of the MOS transistor M2 and the terminal 51 of the MOS transistor M5, and/or a plurality of MOS transistors connected in cascode between the terminal 31 of the MOS transistor M3 and the terminal 62 of the MOS transistor M6. Therefore, the protection circuit 300 further improves the isolation between the reference voltages.

The MOS transistors M5 and M6 are given for illustrative purposes. Various types of devices, including, for example, bipolar junction transistor (BJT), are within the contemplated scope of the present disclosure.

In further embodiments, the MOS transistor M5 is an N-type MOS (NMOS) transistor, and the MOS transistor M6 is a P-type MOS (PMOS) transistor. The terminal 51 of the MOS transistor M5 is a drain terminal of an NMOS transistor, and the terminal 52 of the MOS transistor M5 is a source terminal of an NMOS transistor. The terminal 61 of the MOS transistor M6 is a source terminal of PMOS transistor, and the terminal 62 of the MOS transistor M6 is a drain terminal of the PMOS transistor. The configurations and arrangements of the transistor M5 being the NMOS transistor and the transistor M6 being the PMOS transistor are given for illustrative purposes. Various configurations and arrangements of the transistors M5 and M6 are within the contemplated scope of the present disclosure.

In this document, the term "coupled" may also be termed as "electrically coupled," and the term "connected" may be termed as "electrically connected." "Coupled" and "connected" may also be used to indicate that two or more elements cooperate or interact with each other.

In some embodiments, a circuit is disclosed that includes a first transistor of a first type, a second transistor of a second type, a third transistor of the first type, and a fourth transistor of the second type. The first transistor is diode-connected and has a first terminal configured to receive a first reference voltage, and a second terminal. The second transistor is diode-connected and has a first terminal connected to the second terminal of the first transistor, and a second terminal configured to receive a second reference voltage. The third transistor is diode-connected and has a first terminal configured to receive a third reference voltage, and a second terminal. The fourth transistor is diode-connected and has a first terminal connected to the second terminal of the third transistor, and a second terminal configured to receive a fourth reference voltage and connected to the second terminal of the first transistor.

Also disclosed is a circuit that includes a first diode-connected dummy device, a second diode-connected dummy device, a third diode-connected dummy device, a fourth diode-connected dummy device, and a first discharge path. The second diode-connected dummy device connected in cascode with the first diode-connected dummy device. The fourth diode-connected dummy device connected in cascode with the third diode-connected dummy device. The first and the second diode-connected dummy devices are formed in a first region. The third and the fourth diode-connected dummy devices are formed in a second region which is outside the first region. The first discharge path configured to discharge charges from at least one of the first and the second diode-connected dummy devices in the first region to a reference voltage terminal of one of the third and the fourth diode-connected dummy devices in the second region.

Also disclosed is a method that includes the operations below. Charges are discharged from at least one of a first and a second diode-connected dummy devices in a first region to a reference voltage terminal of one of a third and a fourth diode-connected dummy devices in a second region which is outside the first region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a first transistor of a first type, wherein the first transistor is diode-connected and has a first terminal configured to receive a first reference voltage, and a second terminal, and the first transistor is formed in a deep N-well (DNW) region; and
   a second transistor of a second type, wherein the second transistor is diode-connected and has a first terminal, and a second terminal configured to receive a second reference voltage and connected to the second terminal of the first transistor, and the second transistor is formed in a region outside the deep N-well region.

2. The circuit of claim 1, further comprising:
   a plurality of stacked conductive layers formed between the second terminal of the second transistor and the second terminal of the first transistor.

3. The circuit of claim 1, wherein the first terminal of the first transistor is connected to the first terminal of the second transistor.

4. The circuit of claim 3, further comprising:
   a plurality of stacked conductive layers formed between the first terminal of the first transistor and the first terminal of the second transistor.

5. The circuit of claim 1, further comprising:
   a third transistor of the first type, wherein the third transistor is diode-connected and has a first terminal configured to receive a third reference voltage, and a second terminal; and
   a fourth transistor of the second type, wherein the fourth transistor is diode-connected and has a first terminal connected to the second terminal of the first transistor, and a second terminal configured to receive a fourth reference voltage.

6. The circuit of claim 5, further comprising:
   a fifth transistor of the first type, wherein the fifth transistor is diode-connected between the second terminal of the third transistor and the first terminal of the second transistor; and
   a sixth transistor of the second type, wherein the sixth transistor is diode-connected between the second terminal of the first transistor and the first terminal of the fourth transistor.

7. The circuit of claim 6, wherein the first transistor, the fourth transistor, and the sixth transistor are formed within the deep N-well region, and the second transistor, the third transistor, and the fifth transistor are formed in the region outside the deep N-well region.

8. The circuit of claim 5, wherein the first transistor and the fourth transistor are formed within the deep N-well (DNW) region, and the third transistor and the second transistor are formed in the region outside the deep N-well region.

9. A circuit, comprising:
   a first diode-connected dummy device, wherein the first diode-connected dummy device is formed in a deep N-well (DNW) region;
   a second diode-connected dummy device, wherein the second diode-connected dummy device is formed in a region outside the deep N-well region; and
   a first discharge path configured to discharge charges from the first diode-connected dummy device in the deep N-well region to a reference voltage terminal of the second diode-connected dummy device in the region outside the deep N-well region.

10. The circuit of claim 9, further comprising:
    a third diode-connected dummy device connected in cascode with the second diode-connected dummy device, wherein the third diode-connected dummy device is formed in the region outside the deep N-well region; and
    a fourth diode-connected dummy device connected in cascode with the first diode-connected dummy device, wherein the fourth diode-connected dummy device is formed in the deep N-well region,
    wherein the first discharge path is configured to discharge charges from at least one of the first and the fourth diode-connected dummy devices in the deep N-well region to the reference voltage terminal of one of the second and the fourth diode-connected dummy devices in the region outside the deep N-well region.

11. The circuit of claim 10, wherein the first discharge path comprises:

a plurality of conductive layers stacked and connected between a terminal, where the first and the fourth diode-connected dummy devices are connected, and the reference voltage terminal of one of the second and the third diode-connected dummy devices.

12. The circuit of claim 10, further comprising:
a second discharge path configured to discharge charges from at least one of the second and the third diode-connected dummy devices in the region outside the deep N-well region to a reference voltage terminal of one of the first and the fourth diode-connected dummy devices in the deep N-well region.

13. The circuit of claim 12, wherein the second discharge path comprises:
a plurality of conductive layers stacked and connected between a terminal, where the second and the third diode-connected dummy devices are connected, and the reference voltage terminal of one of the first and the fourth diode-connected dummy devices.

14. The circuit of claim 10, wherein the first and the third diode-connected dummy devices are PMOS transistors, and the second and the fourth diode-connected dummy devices are NMOS transistors.

15. The circuit of claim 10, further comprising:
a fifth diode-connected dummy device connected in cascode with the fourth diode-connected dummy device; and
a sixth diode-connected dummy device connected in cascode with the third diode-connected dummy device.

16. A method, comprising:
discharging charges from at least one of a first and a second diode-connected dummy devices disposed in a first region to a reference voltage terminal of one of a third and a fourth diode-connected dummy devices disposed in a second region which is outside the first region.

17. The method of claim 16, wherein the discharging further comprises:
discharging charges from the first region by a plurality of conductive layers stacked and connected between a terminal, where the first and the second diode-connected dummy devices are connected, and the reference voltage terminal of one of the third and the fourth diode-connected dummy devices.

18. The method of claim 16, further comprising:
discharging charges from at least one of the third and the fourth diode-connected dummy devices disposed in the second region to a reference voltage terminal of one of the first and the second diode-connected dummy devices disposed in the first region.

19. The method of claim 18, wherein the discharging charges from at least one of the third and the fourth diode-connected dummy devices further comprises:
discharging charges from the second region by a plurality of conductive layers stacked and connected between a terminal, where the third and the fourth diode-connected dummy devices are connected, and the reference voltage terminal of one of the first and the second diode-connected dummy devices.

20. The method of claim 18, wherein the first region is a deep N-well (DNW) region, and the second region is a region which is outside the deep N-well region.

* * * * *